United States Patent
Binns et al.

(10) Patent No.: US 9,478,333 B2
(45) Date of Patent: Oct. 25, 2016

(54) PROCESS AND APPARATUS FOR FORMING MAGNETIC STRUCTURES ON A SUBSTRATE

(71) Applicant: Nano Resources Limited, Gloucestershire (GB)

(72) Inventors: Robert Davidson Binns, Gloucestershire (GB); Christopher Robin Binns, Gloucestershire (GB)

(73) Assignee: Nano Resources Limited, Gloucestershire (GB)

( * ) Notice: Subject to any disclaimer, the term of this patent is extended or adjusted under 35 U.S.C. 154(b) by 0 days.

(21) Appl. No.: 14/428,948

(22) PCT Filed: Sep. 17, 2013

(86) PCT No.: PCT/GB2013/052426
§ 371 (c)(1),
(2) Date: Mar. 17, 2015

(87) PCT Pub. No.: WO2014/041377
PCT Pub. Date: Mar. 20, 2014

(65) Prior Publication Data
US 2015/0248955 A1    Sep. 3, 2015

(30) Foreign Application Priority Data
Sep. 17, 2012 (GB) .................................. 1216538.7

(51) Int. Cl.
*H01F 7/00* (2006.01)
*H01F 3/00* (2006.01)
(Continued)

(52) U.S. Cl.
CPC ........... *H01F 1/0551* (2013.01); *C23C 14/223* (2013.01); *H01F 10/007* (2013.01); *H01F 41/301* (2013.01); *B82Y 25/00* (2013.01); *H01F 1/0054* (2013.01)

(58) Field of Classification Search
CPC .. H01F 1/0551; H01F 10/007; H01F 41/301; H01F 1/0054; C23C 14/223; B82Y 25/00
See application file for complete search history.

(56) References Cited

U.S. PATENT DOCUMENTS

2004/0115340 A1    6/2004  Griego
2009/0052007 A1*   2/2009  Lee et al. .............. 359/283
(Continued)

FOREIGN PATENT DOCUMENTS

| CN | 102513719 A | 6/2012 |
| JP | S5931894 A | 2/1984 |
| JP | S60217604 A | 10/1985 |
| WO | WO-2012/159096 A2 | 11/2012 |

OTHER PUBLICATIONS

International Search Report mailed Dec. 9, 2013; Authorized Officer: Detlef Angermeier.

*Primary Examiner* — Bernard Rojas
(74) *Attorney, Agent, or Firm* — Winstead PC

(57) ABSTRACT

The invention relates to a process of and apparatus for forming a magnetic structure on a substrate and a magnetic structure formed by such a process and apparatus. The magnetic structure comprises a matrix in which magnetic particles are embedded. The apparatus for forming the magnetic structure on the substrate comprises a source of matrix deposits the matrix material onto the substrate to form the matrix, and comprises a source of magnetic particles which deposit the magnetic particles onto the matrix as the matrix forms to embed the magnetic particles in the matrix. Each magnetic particle comprises a core covered with a layer of metal, at least one of the matrix material and the core is of ferromagnetic material and the core and the layer of metal are of different materials.

22 Claims, 3 Drawing Sheets

(51) Int. Cl.
*H01F 1/055* (2006.01)
*H01F 10/00* (2006.01)
*H01F 41/30* (2006.01)
*C23C 14/22* (2006.01)
*B82Y 25/00* (2011.01)
*H01F 1/00* (2006.01)

(56) References Cited

U.S. PATENT DOCUMENTS

2010/0101700 A1    4/2010   Liang et al.
2010/0190006 A1*   7/2010   Li et al. ........................ 428/407

* cited by examiner

PROCESS AND APPARATUS FOR FORMING MAGNETIC STRUCTURES ON A SUBSTRATE

FIELD OF THE INVENTION

The present invention relates to a process of and apparatus for forming magnetic structures comprising particles embedded in a matrix and in particular but not exclusively nanoparticles embedded in the matrix. The present invention further relates to magnetic structures formed by such a process or apparatus.

BACKGROUND TO THE INVENTION

Magnetic materials find widespread use in modern technology and are to be found in nearly all electro-mechanical apparatus. The performance of magnetic materials in respect of their secondary parameters, such as coercivity and energy product, has improved greatly over the last century. There has nevertheless been little improvement in the most fundamental property, i.e. saturation magnetisation, which determines the strength of produced magnetic field. The most magnetic material for use in electro-mechanical apparatus, i.e., $Fe_{60}Co_{40}$ alloy, has been available since the 1920s and until recently there has been no material found with a higher magnetisation.

The most direct measure of saturation magnetisation is the magnetic moment per atom which is specified in Bohr magnetons ($\mu_B$). The magnetic moment for pure Fe is $2.22\mu_B$ per atom whereas for $Fe_{80}Co_{40}$ alloy the magnetic moment is $2.45\mu_B$ per atom. The latter value, i.e., $2.45\mu_B$ per atom, is termed the Slater-Pauling limit and was believed to be the ultimate magnetisation available from transition metal alloys. Generally the efficiency of electro-mechanical apparatus improves as the square of the magnetisation of the magnetic material. Even small increases in magnetisation are therefore valuable especially in green technologies such as electric vehicles and wind turbines.

Upon development in the early 1990s of gas-phase nanoparticle sources capable of depositing nanoparticles with diameters in the range of 1 to 5 nm it was discovered that the magnetic moments per atom of Fe, Co and Ni nanoparticles with diameters no more than about 5 nm are significantly higher than for bulk structures formed from the same material. In view of this, magnetic structures in which nanoparticles of one of Fe and Co are embedded in a matrix of the other of Fe and Co have been developed with such magnetic structures having a magnetisation which exceeds the magnetisation of $Fe_{60}Co_{40}$ alloy to thereby break the Slater-Pauling limit for the first time. FIG. 1A illustrates the formation of one such magnetic structure. As shown in FIG. 1A a magnetic structure 10 is formed by co-deposition on a substrate 12 of Fe nanoparticles 14 from a cluster source 16 and of Co matrix material 18 from a Molecular Beam Epitaxy (MBE) source 20. Co-deposition of Fe nanoparticles and Co matrix material results in a structure in which Fe nanoparticles are distributed through and embedded in the Co matrix. According to an alternative approach a magnetic structure in which Co nanoparticles are distributed through and embedded in an Fe matrix is formed by co-deposition of Co nanoparticles from the cluster source and of Fe matrix material from the MBE source.

The magnetic moment per atom for each of a structure having Fe nanoparticles in a Co matrix and a structure having Co nanoparticles in an Fe matrix are shown in FIG. 1B as a function of the Fe volume fraction. FIG. 1B also shows the Slater-Pauling curve for $Fe_{60}Co_{40}$ alloy as a function of the Fe volume fraction. As can be seen from FIG. 1B the best results are obtained from Co nanoparticles embedded in an Fe matrix which yields values approaching $3\mu_B$ per atom. At lower Fe volume fractions the magnetic moment per atom for Fe nanoparticles embedded in a Co matrix exceeds the corresponding value defined by the Slater-Pauling curve. The improvement is seen because the fundamental building blocks of the material already have an enhanced magnetisation and also because the matrix itself has a nanostructure which leads to enhanced moments. More specifically there is a higher proportion of atoms at a surface or interface in a nanostructure (approaching 50% in the presently described structure) with each such atom having enhanced spin and orbital moments. On the other hand and as can be seen from the left half of the graph of FIG. 1B the magnetisation falls below the Slater-Pauling curve at Fe volume fractions of more than about 20% which is the percolation threshold.

The present inventors have appreciated that the high level of aggregation of Fe nanoparticles at higher levels of Fe volume fractions produces a phase separated mixture of macroscopic grains and the magnetisation falls as a consequence to a weighted average of the magnetic moments of Co ($1.7\mu_B$ per atom) and Fe ($2.22\mu_B$ per atom). This is the reason for the fall in the magnetisation to below the Slater-Pauling curve as seen in FIG. 1B. The present inventors have further appreciated that an improvement in performance may be gained by providing for an increase in the nanoparticle volume fraction without marked aggregation.

The invention has been devised in the light of the above mentioned appreciation. It is therefore an object for the present invention to provide an improved process of forming a magnetic structure comprising magnetic particles and in particular magnetic nanoparticles embedded in a matrix. It is a further object for the present invention to provide improved apparatus for forming a magnetic structure comprising magnetic particles and in particular magnetic nanoparticles embedded in a matrix. It is a yet further object for the present invention to provide an improved magnetic structure comprising magnetic particles and in particular magnetic nanoparticles embedded in a matrix.

STATEMENT OF INVENTION

According to a first aspect of the present invention there is provided a process of forming a magnetic structure on a substrate, the process comprising:
depositing a matrix material onto the substrate to thereby form a matrix; and
depositing magnetic particles onto the matrix as the matrix forms to thereby embed the magnetic particles in the matrix, in which
each magnetic particle comprises a core covered at least in part with a layer of metal, at least one of the matrix material and the core is of ferromagnetic material and the core and the layer of metal are of different materials.

In use the matrix material and the magnetic particles are deposited to form a matrix on the substrate in which the magnetic particles are embedded. The matrix material and the magnetic particles may be deposited simultaneously, for example, by simultaneous operation of a source of matrix material, such as a Molecular Beam Epitaxy (MBE) source, and a source of magnetic particles, such as a thermal gas aggregation source. A magnetic structure may thereby be formed in which magnetic particles are distributed through and embedded in the matrix. The magnetic structure is typically formed as a thin film on the substrate. Covering the core at least in part with a layer of metal of different material composition to the core reduces the likelihood of cores coming into contact at particle volume fractions higher than the percolation threshold. Aggregation of magnetic particles is therefore reduced and an increase in magnetisation seen over structures formed from magnetic particles lacking the layer of metal.

The process may be suited to the deposition of nanoparticles onto the matrix. The step of depositing magnetic particles may therefore comprise depositing magnetic nanoparticles. Each magnetic particle may be of a diameter of no more than substantially 100 nm, 60 nm, 30 nm, 20 nm, 15 nm or 10 nm. The magnetic moment per atom of magnetic nanoparticles of diameter between substantially 1 nm and substantially 5 nm has been found to be significantly higher than for bulk structures formed from the same material. Each magnetic particle may therefore be of a diameter of no more than substantially 5 nm, 4 nm, 3 nm, 2 nm or 1 nm. Each magnetic particle may be of a diameter of more than substantially 0.5 nm, 1 nm, 2 nm, 3 nm or 4 nm. The layer of metal may have a thickness of no more than substantially 4 nm, 2 nm, 1 nm, 0.8 nm, 0.6, 0.4 nm or 0.2 nm. Considering the thickness of the metal layer in terms of atomic layers, the thickness may be between 1 and 10 atomic layers such as no more than 10, 8, 6, 4, 2 or 1 atomic layers. For example where a core has a diameter of substantially 5 nm the layer of metal may be a single atomic layer thick such as substantially 0.2 nm thick.

The layer of metal may substantially cover the core. A surface of the layer of metal may define an exterior surface of the magnetic particle. The matrix material may be of the same material as the layer of metal. For example each magnetic particle may comprise a Fe core covered at least in part with a layer of Co and the matrix material may be Co. By way of further example each magnetic particle may comprise a Co core covered at least in part with a layer of Au and the matrix material may be Au. Using the same material for the layer and the matrix may be advantageous in hipermag applications. Use of the same material may reduce the likelihood of the particle cores coming into contact even at volume fractions much higher than the percolation threshold.

The core may be formed from a ferromagnetic material, such as a ferromagnetic element. More specifically the ferromagnetic material may be a ferromagnetic transition metal, such as one of Fe, Co and Ni. The matrix material may be a metal and more specifically one of a transition metal and a rare earth metal. The core and the matrix material may be formed from different materials. Where the matrix material is a transition metal the transition metal may be ferromagnetic or diamagnetic. The metal layer may be one of a transition metal and a rare earth metal. The metal layer may be a ferromagnetic or diamagnetic transition metal. For hipermag applications it is preferred that each magnetic particle comprises a core formed from a ferromagnetic transition metal and either a ferromagnetic transition metal layer or a diamagnetic transition metal layer. The diamagnetic transition metal may be a Group 11 metal such as gold or silver. Thus the core/layer composition for hipermag applications may be Fe/Co, Co/Fe, Fe/Ag, Co/Ag, Fe/Au or Co/Au. As mentioned above use of the same material for the layer and the matrix may be advantageous in hipermag applications such that the matrix is formed from a metal layer matching ferromagnetic or diamagnetic transition metal.

Deposition of the magnetic particles may be by way of vacuum assisted deposition of magnetic particles in the gas phase and more specifically by way of deposition of a beam of gas-phase magnetic particles. The process may thus comprise causing a beam of magnetic particles to impinge upon the matrix as the matrix forms. The beam may be generated by a gas phase source and more specifically by a cluster beam source, such as a gas aggregation source. The gas phase source may be operative to produce a beam of particle cores absent their layer of metal. A layer of metal may be provided on each core as described herein below. The different forms of gas-phase source generate particles in different size ranges when operated at optimum flux (output) levels. A sputter gas aggregation source normally generates particles having a diameter of about 10 nm when operative at an optimum flux level. A thermal gas aggregation source normally generates smaller particles of about 2 nm diameter when operative at an optimum flux level. The thermal gas aggregation source is often preferred for the formation of high performance magnetic structures (so called hipermags). Deposition of the matrix material may be by way of vacuum assisted deposition of the matrix material in the gas phase and more specifically by way of deposition of an atomic beam of matrix material. The process may thus comprise causing an atomic beam of matrix material to impinge upon the substrate. The atomic beam may be generated by an evaporator, for example, a thermal evaporator such as an MBE source or by sputtering. Forming the magnetic structure by means of an atomic beam of matrix material from an evaporator and a beam of magnetic particles from a cluster source may confer the advantage of providing for independent control over the grain size and volume fraction in the magnetic structure.

The process may further comprise depositing the layer of metal on the core of each magnetic particle. Deposition of the layer of metal may be by vacuum assisted deposition of metal vapour. Metal vapour may therefore be provided in a same vacuum as a source of particle cores. The metal vapour may be generated by an evaporator such as a thermal evaporator. The temperature of the thermal evaporator may be determined by the metal to be deposited, e.g. 800° C. for silver and 1000° C. for iron. A thickness of the layer of metal may be controlled by varying the operative temperature of the thermal evaporator in view of it normally being impossible to change the velocity of the particle core beam. The evaporator may be disposed between the source of particle cores and the substrate. In addition the evaporator may be configured to define a space through which a beam of particle cores pass, the evaporator being operative to form a vapour of metal in the space whereby the vapour impinges upon a surface of each particle core. The evaporator may be configured to surround the beam of particle cores. The evaporator may therefore provide for improved coverage of the whole surface of the particle cores. The evaporator may, for example, define a tube through which the beam of particle cores passes. The process may further comprise accelerating a beam of magnetic particles before their deposition onto the matrix. Acceleration may be after deposition of a layer of metal. Acceleration may be achieved by means of apparatus which is configured to interact with the beam of magnetic particles. A venturi may, for example, be used.

Each magnetic particle may comprise a plurality of layers over the core. The layers may be formed from the same material as each other or one another or different material to each other or one another. The process may therefore comprise a deposition step for each layer. Deposition of each layer may be by vacuum assisted deposition from a thermal evaporator as described above. The plural evaporators may be disposed in line whereby, for example, a first evaporator provides for deposition of a first layer and a second evaporator provides for deposition of a second layer.

The heavy rare earth metals have much higher magnetic moments than transition metals. For example the magnetic moment of Dy reaches $10\mu_B$ per atom. Generally rare earth metals are of themselves of limited use for technology on account of their low Curie temperature, which for most rare earth metals is below room temperature, and their magnetic hardness, which requires very high magnetic fields to achieve saturation. Incorporation of transition metals raises the Curie temperature and makes the rare earth and transition metal composition magnetically softer. On the other hand the transition metal magnetically polarises in the opposite direction to the rare earth metal whereby the moment of the composition rapidly decreases as the volume fraction of the transition metal is increased. This problem may be addressed by providing magnetic particles having the structure described above. Each magnetic particle may therefore comprise a core formed from a transition metal covered at least in part with a layer of an antiferromagnetic material and more specifically an antiferromagnetic transition metal, such as Cr or Mn. The matrix material may be a rare earth metal, such as Dy or Ho. The core may be formed from a ferromagnetic transition metal, such as Fe or Co. The layer of antiferromagnetic material may induce a parallel alignment of the magnetic moment of the rare earth matrix and the transition metal core. The thickness of the layer of antiferromagnetic material may be between 1 and 10 atomic layers such as no more than 10, 8, 6, 4, 2 or 1 atomic layers. In addition each magnetic particle may comprise a second layer which covers the layer of antiferromagnetic material at least in part, the second layer being formed from a rare earth metal. More specifically the second layer and the matrix may be of the same rare earth metal. The thickness of the second layer may be between 1 and 10 atomic layers such as no more than 10, 8, 6, 4, 2 or 1 atomic layers. Provision of the second layer may decrease agglomeration of magnetic particles in the magnetic structure.

The substrate on which the magnetic structure is formed may constitute a component forming part or to form part of a product. For example the magnetic structure may be formed on part of a roll of material in reel to reel coating apparatus. By way of further examples the substrate may be a component forming part or to form part of the like of an electric motor or mobile telephone. As mentioned above the magnetic structure is typically formed as a thin film on the substrate. Formation of the magnetic structure as a bulk structure is normally much less readily achieved. Nevertheless the magnetic structure may be formed on a critical magnetic component, e.g. at strategic locations, in the like of electro-mechanical apparatus to amplify the magnetic field of the magnetic component.

The present inventors have appreciated the formation of a magnetic structure comprising magnetic particles having a core and a layer of metal to be of wider application than hitherto described. For example an advantage of the use of Au or Ag as either a first or subsequent layer over the core of the magnetic particles is that such magnetic particles can be deposited in a liquid nitrogen cooled matrix of ice. When the matrix with its embedded magnetic particles is complete the temperature is allowed to increase and the resulting magnetic particle containing liquid can be sprayed onto a desired surface to thereby deposit the magnetic particles upon the surface. The process may therefore comprise depositing a matrix material on a substrate to form a solid matrix, depositing magnetic particles comprising a layer of diamagnetic transition metal onto the matrix as the matrix forms and raising the temperature of the thus formed magnetic structure to thereby form a liquid containing magnetic particles. The diamagnetic transition metal may be a Group 11 metal, such as gold or silver. The process may comprise depositing a matrix material of liquid form at ambient, e.g. room, temperature onto a substrate in an environment such as to form a solid matrix. An environment such as to form a solid matrix may be created in dependence on control of at least one of temperature and pressure. The environment may be created by means of a temperature reducing arrangement, such as refrigeration apparatus. The matrix material may comprise a compound and more specifically a polar molecular compound such as water.

According to a second aspect of the present invention there is provided apparatus for forming a magnetic structure on a substrate, the apparatus comprising:
  a source of matrix material which is operable to deposit the matrix material onto the substrate to thereby form a matrix; and
  a source of magnetic particles which is operable to deposit the magnetic particles onto the matrix as the matrix forms to thereby embed the magnetic particles in the matrix, in which
  each magnetic particle comprises a core covered at least in part with a layer of metal, at least one of the matrix material and the core is of ferromagnetic material and the core and the layer of metal are of different materials.

In use the source of matrix material and the source of magnetic particles may be operated simultaneously to thereby deposit the matrix material and the magnetic particles simultaneously. The source of matrix material and the source of magnetic particles may be configured to direct a beam of matrix material and a beam of magnetic particles towards the substrate. A matrix in which magnetic particles are embedded is thereby formed. The source of magnetic particles may comprise a gas phase source and more specifically a cluster beam source, such as a gas aggregation source. The source of matrix material may comprise an evaporator, for example, a thermal evaporator such as an MBE source or sputtering apparatus.

The apparatus may further comprise an evaporator such as a thermal evaporator which is operable to deposit the layer of metal on the core of each magnetic particle. The evaporator may be disposed between a source of particle cores and the substrate. In addition the evaporator may be configured to define a space through which a beam of particle cores pass, the evaporator being operative to form a vapour of metal in the space whereby the vapour impinges upon a surface of each particle core. The apparatus may further comprise an arrangement, such as a venturi, operable to accelerate a beam of magnetic particles before their deposition onto the matrix. The apparatus may further comprise a temperature reducing arrangement, such as refrigeration apparatus, which is operable to reduce a temperature of the matrix as it forms on the substrate.

Further embodiments of the second aspect of the present invention may comprise one or more features of the first aspect of the present invention.

According to a third aspect of the present invention there is provided a magnetic structure on a substrate, the magnetic structure comprising a matrix formed from a matrix material and magnetic particles embedded in the matrix, each magnetic particle comprising a core covered at least in part with a layer of metal, at least one of the matrix material and the core is of ferromagnetic material and the core and the layer of metal are of different materials.

Embodiments of the third aspect of the present invention may comprise one or more features of the first aspect of the present invention.

According to a fourth aspect of the present invention there is provided a product comprising a component, the component comprising a magnetic structure according to the third aspect of the present invention. The product may, for example, be the like of an electric motor or mobile telephone and the component may be the like of a magnetic arrangement. Embodiments of the fourth aspect of the present invention may comprise one or more features of the third aspect of the present invention.

According to a further aspect of the present invention there is provided a process of forming a magnetic structure on a substrate, the process comprising: depositing a matrix material onto the substrate to thereby form a matrix; and depositing magnetic particles onto the matrix as the matrix forms to thereby embed the magnetic particles in the matrix, in which each magnetic particle comprises a core covered at least in part with a layer of material. Embodiments of the further aspect of the present invention may comprise one or more features of the first aspect of the present invention.

BRIEF DESCRIPTION OF DRAWINGS

The present invention will now be described by way of example only with reference to the following drawing, of which.

DESCRIPTION OF EMBODIMENTS

Figure 1A:
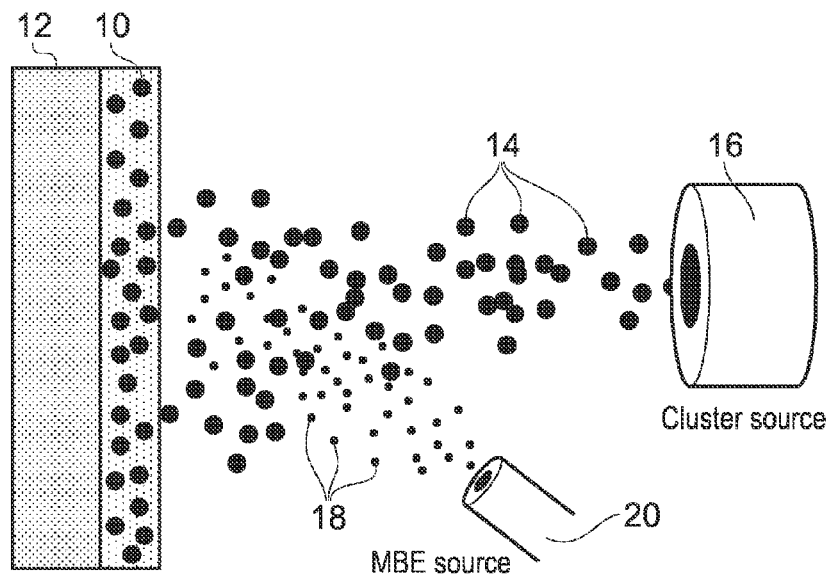
FIG. 1A illustrates the formation of a known magnetic structure.
Figure 1B:
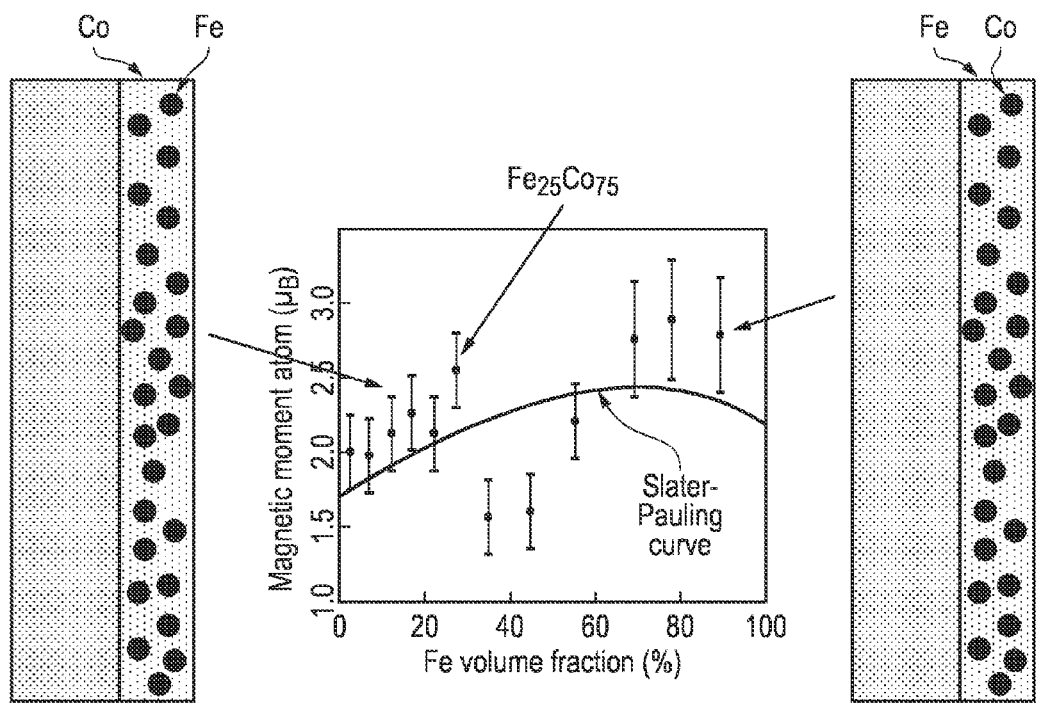
FIG. 1B contains a graph of magnetic moment per atom as a function of the Fe volume fraction for magnetic structures having Fe nanoparticles in a Co matrix and Co nanoparticles in an Fe matrix.

Apparatus for and a process of forming a known magnetic structure comprising a matrix with embedded particles formed from a ferromagnetic transition metal have been described above with reference to FIGS. 1A and 1B.

Figure 2A:
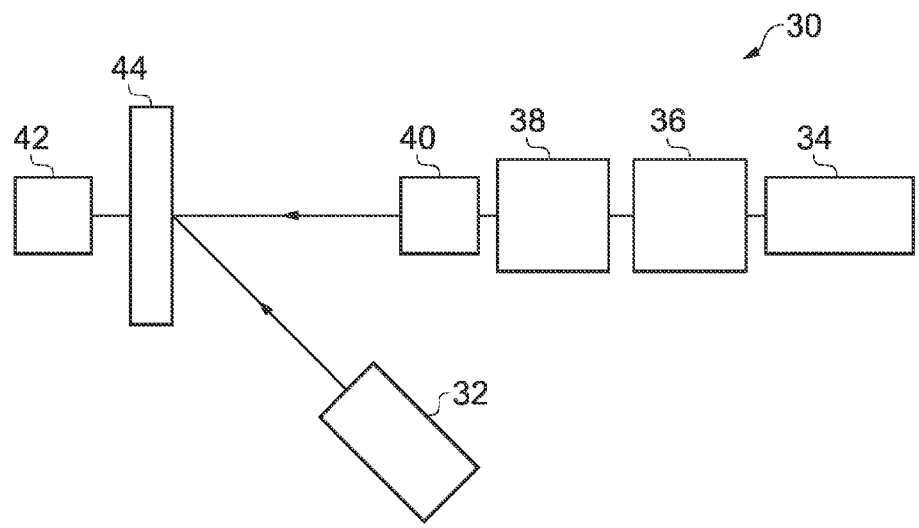
FIG. 2A shows in block diagram form apparatus for forming a magnetic structure according to the present invention.

Turning now to the present invention FIG. 2A shows in block diagram form apparatus 30 for forming a magnetic structure according to the present invention. The apparatus 30 comprises an MBE source 32, a thermal gas aggregation source 34, a first thermal evaporator 36, a second thermal evaporator 38 and a venturi 40. The apparatus 30 further comprises refrigeration apparatus 42 which is operative with liquid nitrogen in certain embodiments to refrigerate a substrate 44 and its environs. The thermal gas aggregation source 34 and the first and second thermal evaporators 36, 38 are operative in the same vacuum. As is described further below the MBE source 32 is operative to generate an atomic beam of matrix material and the thermal gas aggregation source 34 is operative at the same time to generate a beam of nanoparticles. The two beams are deposited simultaneously on the substrate 44 to form a magnetic structure in the form of a thin film matrix formed from deposited matrix material with nanoparticles distributed through and embedded in the matrix. The substrate 44 constitutes a component forming part or to form part of a product. According to one application example the substrate 44 is constituted by part of a roll of material in reel to reel coating apparatus. According to another application example the substrate 44 forms part or will form part of the like of an electric motor or mobile telephone. According to a further application example the substrate 44 is constituted by one of several strategic locations on a critical magnetic component in electro-mechanical apparatus or the like. In use the magnetic structure is operative to amplify the magnetic field of the magnetic component.

Figure 2B:
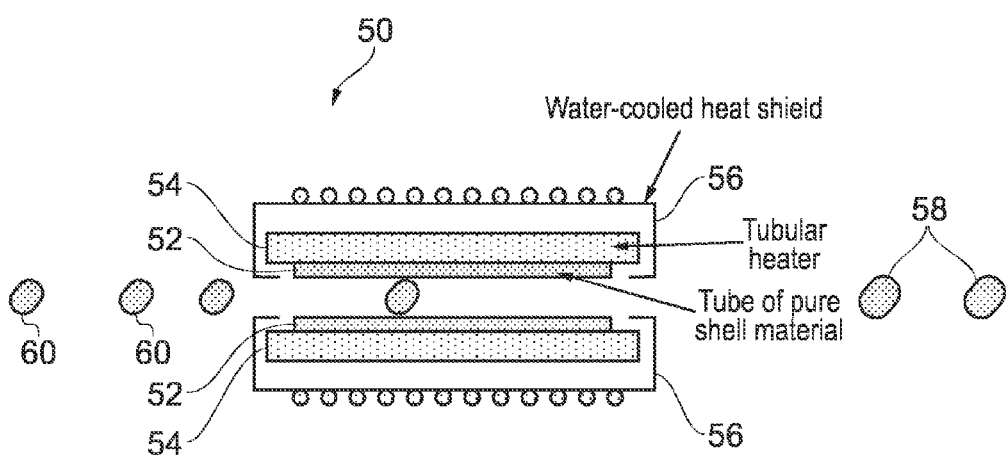
FIG. 2B shows apparatus for coating a core of a nanoparticle.

The first and second thermal evaporators 36, 38 of FIG. 2A are of the same form and function. FIG. 2B provides a detailed view of the first and second thermal evaporators 50. The thermal evaporator 50 is of generally tubular form such that it defines a bore through which a beam of nanoparticles may pass. The thermal evaporator 50 comprises a tube of pure material 52 which is to be deposited as a layer on each of the nanoparticles passing through the thermal evaporator. The thermal evaporator 50 further comprises a tubular heater 54 which surrounds and is adjacent the tube of pure material 52. A water cooled heat shield 56 surrounds the outwardly directed surface of the tubular heater 54 and the end faces of the tubular heater 54 and the tube of pure material 52. In use the thermal evaporator 50 is operative to vaporise the pure material 52 with the material vapour being present in the bore of the thermal evaporator. A beam of uncoated nanoparticles 58 is received at one end of the bore of the thermal evaporator 50 and on passing through the material vapour in the bore the nanoparticles are coated with a layer of the material. The coated nanoparticles 60 then leave the other end of the bore of the thermal evaporator. In forms of the apparatus 30 nanoparticles are coated with only one layer of material. According to such forms the second thermal evaporator 38 of the apparatus of FIG. 2A is either absent or inoperative. In other forms of the apparatus 30 nanoparticles are coated with first and second layers of the same or different material. According to such forms the first thermal evaporator 36, 50 comprises a tube of a first material 52 and the second thermal evaporator 38, 50 comprises a tube of the first material or a second different material 52. In further forms of the apparatus 30 nanoparticles are coated with third and further layers of the same or different material. According to such further forms the apparatus 30 comprises thermal evaporators which correspond in number to the number of layers to be deposited on the nanoparticles with the plural thermal evaporators disposed in line such that the beam of nanoparticles can pass in turn through the bore of each of the thermal evaporators.

A first embodiment of a process of forming a magnetic structure on the substrate will now be described with reference to FIGS. 2A and 2B. According to the first embodiment only one layer of material is deposited on the nanoparticles. As stated above the second thermal evaporator 38 of FIG. 2A is therefore either absent or inoperative. The thermal gas aggregation source 34 is operative to generate a beam of Fe nanoparticles of diameters in the range of 1 nm to 5 nm. The diameter of the Fe nanoparticles is determined by controlling the power level and the gas pressure of the thermal gas aggregation source 34. The beam of Fe nanoparticles passes through the bore of the first thermal evaporator 36 which comprises a tube 52 of either Co or Ag. Each Fe nanoparticle is therefore coated with a layer of either Co or Ag to a thickness of between 1 and 10 atomic layers. The operative temperature of the first thermal evaporator 36 is determined by the material to be deposited. The operative temperature for Ag is about 800° C. As mentioned above the thickness of the layer depends on the velocity of the nanoparticles, which cannot be controlled, and the temperature. If it is desired to increase the thickness of the layer the operative temperature need only be increased slight because the vapour pressure is very sensitive to temperature. For example to double the thickness of an Ag layer it is only necessary to increase the temperature by about 50° C. In such composite nanoparticles Fe constitutes the core of the nanoparticles. The MBE source 32 is operative at the same time as the thermal gas aggregation source 34 to generate an atomic beam of either Co or Ag such that the atomic beam is of the same material as the coating on the Fe nanoparticles. The atomic beam and the beam of nanoparticles are deposited simultaneously on the substrate 44 to form a magnetic structure comprising a matrix formed by the atomic beam in which nanoparticles are embedded. The layer of material on the Fe core decreases the likelihood of the Fe cores coming into contact with one another. By way of example and to provide a comparison with the performance of uncoated cores as described above with reference to FIG. 1B, if the Fe cores have a diameter of 5 nm and the coating is of a single atomic layer of 0.2 nm the volume fraction of the core can be increased to 66% without agglomeration compared to about 20% if uncoated Fe nanoparticles are used.

Figure 3:
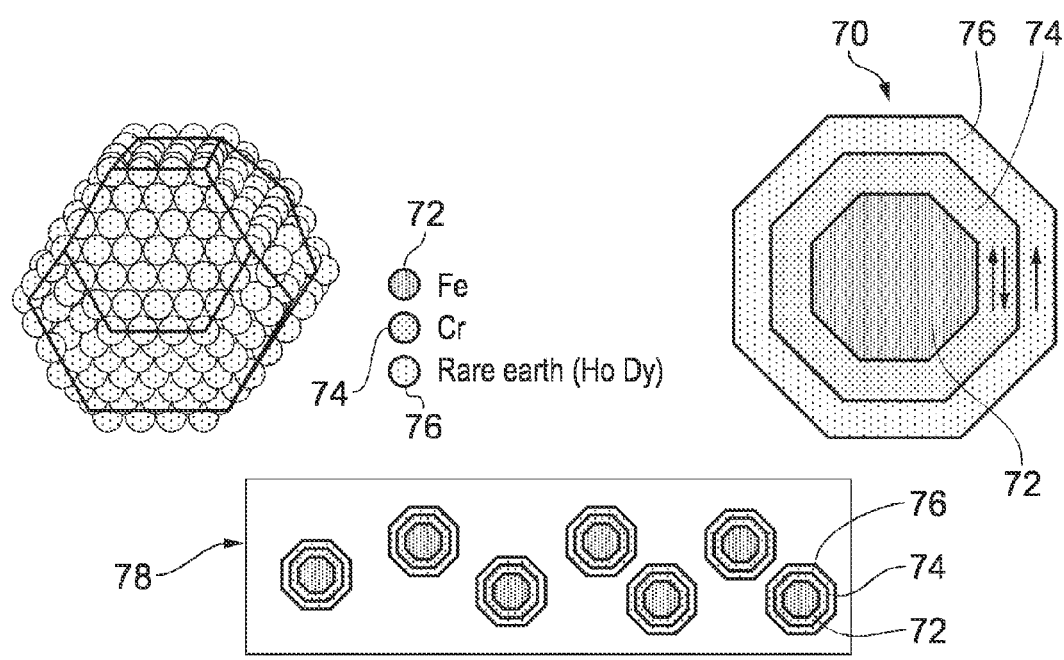
FIG. 3 shows a nanoparticle having an Fe core, a first layer of Cr and a second outer layer of a rare earth metal.

A second embodiment of process of forming a magnetic structure on the substrate will now be described with reference to FIGS. 2A and 2B. According to the second embodiment two layers of material are deposited in turn on the nanoparticles. As stated above the second thermal evaporator 38 of FIG. 2A is therefore operative. The thermal gas aggregation source 34 is operative to generate a beam of Co nanoparticles of diameters in the range of 1 nm to 5 nm. The diameter of the Co nanoparticles is determined by controlling the power level and the gas pressure of the thermal gas aggregation source 34. The beam of Co nanoparticles passes through the bore of the first thermal evaporator 36 which comprises a tube 52 of an anti-ferromagnetic material such as Cr or Mn. Each Co nanoparticle is therefore coated with a layer of either Cr or Mn to a thickness of between 1 and 10 atomic layers. Then the nanoparticles pass through the bore of the second thermal evaporator 38 which in one form comprises a tube 52 of a rare earth metal such as Ho or Dy. Each nanoparticle is therefore coated with a second layer of either Ho or Dy to a thickness of between 1 and 10 atomic layers. In another form the nanoparticles pass through the bore of the second thermal evaporator 38 which comprises a tube 52 of the same anti-ferromagnetic material as the first thermal evaporator 36. The operative temperatures of the first and second thermal evaporators 36, 38 are determined by the material to be deposited. FIG. 3 shows a perspective view of a Co core coated with a layer of each of Cr and a rare earth metal (i.e. Ho or Dy). FIG. 3 shows a section through a coated nanoparticle 70 with Co forming the core 72, Cr forming a layer immediately over the Co core and either Ho or Dy forming an exterior layer immediately over the Cr layer. FIG. 3 further shows a beam of nanoparticles 78 after deposition of the Cr layer and Ho or Dy layer. The MBE source 32 is operative at the same time as the thermal gas aggregation source 34 to generate an atomic beam of either Ho or Dy such that the atomic beam is of the same material as the outer coating on the Co nanoparticles. The atomic beam and the beam of nanoparticles are deposited simultaneously on the substrate 44 to form a magnetic structure comprising a matrix formed by the atomic beam in which nanoparticles are embedded.

A third embodiment of process of forming a magnetic structure on the substrate will now be described with reference to FIGS. 2A and 2B. According to the third embodiment only one layer of material is deposited on the nanoparticles. As stated above the second thermal evaporator 38 of FIG. 2A is therefore either absent or inoperative. The thermal gas aggregation source 34 is operative to generate a beam of Fe nanoparticles of diameters in the range of 1 nm to 5 nm. The beam of Fe nanoparticles passes through the bore of the first thermal evaporator 36 which comprises a tube 52 of either Au or Ag. Each Fe nanoparticle is therefore coated with a layer of either Au or Ag to a thickness of between 1 and 10 atomic layers. The operative temperature of the first thermal evaporator 36 is determined by the material to be deposited. A thermal evaporator is employed in the apparatus of FIG. 2 instead of the MBE source 32. The thermal evaporator is operative on a body of water to direct water vapour such that it impinges upon the substrate 44. The substrate is refrigerated by the refrigeration apparatus 42 whereby the impinging water vapour is deposited as ice on the substrate 44. The ice and the nanoparticles are deposited simultaneously on the substrate 44 to form a magnetic structure comprising an ice matrix in which nanoparticles are embedded. When the magnetic structure is formed the temperature is raised to room temperature to provide a liquid containing the nanoparticles. The liquid is then sprayed onto a desired surface to deposit the nanoparticles upon the surface. The present embodiment is particularly useful in applications, such as in the medical field, where a hipermag layer is provided to surfaces within inorganic or organic destinations inaccessible other than by fluids.

The invention claimed is:

1. A process of forming a magnetic structure on a substrate, the process comprising:
    depositing a layer of metal onto respective particle cores so as to produce a plurality of magnetic particles comprising a core covered at least in part by a layer of such metal;
    depositing a matrix material onto the substrate to thereby form a matrix; and
    causing a beam of said magnetic particles to impinge upon the matrix as the matrix forms, thereby depositing the magnetic particles onto the matrix as the matrix forms so as to embed the magnetic particles in the matrix, wherein each magnetic particle comprises a core covered at least in part with a layer of metal, at least one of the matrix material and the core is of ferromagnetic material and the core and the layer of metal are of different materials.

2. The process according to claim 1 in which the step of depositing magnetic particles comprises depositing magnetic nanoparticles.

3. The process according to claim 1 in which the matrix material is of the same material as the layer of metal.

4. The process according to claim 1 in which the matrix material is one of a transition metal and a rare earth metal.

5. The process according to claim 1 in which the matrix material is one of a ferromagnetic transition metal and a diamagnetic transition metal.

6. The process according to claim 1 in which each magnetic particle comprises a core formed from a ferromagnetic transition metal and one of a ferromagnetic transition metal layer and a diamagnetic transition metal layer.

7. The process according to claim 1 comprising causing an atomic beam of matrix material to impinge upon the substrate.

8. The process according to claim 1 in which each magnetic particle comprises a plurality of layers over the core, the layers being formed from one of: different material to each other or one another; and the same material as each other or one another.

9. The process according to claim 1 in which each magnetic particle comprises a core formed from a transition metal covered at least in part with a layer of an antiferromagnetic material and in which the matrix material is a rare earth metal.

10. The process according to claim 9 in which each magnetic particle comprises a core formed from a transition metal covered at least in part with a layer of an antiferromagnetic material and in which the matrix material is a rare earth metal, and in which each magnetic particle comprises a second layer which covers the layer of antiferromagnetic material at least in part, the second layer being formed from a rare earth metal, and in which the second layer and the matrix is of the same rare earth metal.

11. The process according to claim 1 in which each magnetic particle comprises a core formed from a transition metal covered at least in part with a layer of an antiferromagnetic material and in which the matrix material is a rare earth metal, and in which the layer is formed from an antiferromagnetic transition metal and the core is formed from a ferromagnetic transition metal.

12. The process according to claim 1 in which each magnetic particle comprises a core formed from a transition metal covered at least in part with a layer of an antiferromagnetic material and in which the matrix material is a rare earth metal, and in which each magnetic particle comprises a second layer which covers the layer of antiferromagnetic material at least in part, the second layer being formed from a rare earth metal.

13. The process according to 1 comprising depositing a matrix material on a substrate to form a solid matrix, depositing magnetic particles comprising a layer of diamagnetic transition metal onto the matrix as the matrix forms and raising the temperature of the thus formed magnetic structure to thereby form a liquid containing magnetic particles.

14. The process according to claim 1 comprising depositing a matrix material on a substrate to form a solid matrix, depositing magnetic particles comprising a layer of diamagnetic transition metal onto the matrix as the matrix forms and raising the temperature of the thus formed magnetic structure to thereby form a liquid containing magnetic particles, in which the diamagnetic transition metal is a Group 1 1 metal and the matrix material comprises a polar molecular compound.

15. An apparatus for forming a magnetic structure on a substrate, the apparatus comprising:
  a source of magnetic particles operable to deposit a layer of metal onto respective particle cores so as to produce the plurality of magnetic particles comprising a core covered at least in part by a layer of such metal;
  a source of matrix material which is operable to deposit the matrix material onto the substrate to thereby form a matrix;
  wherein the source of magnetic particles is operable to deposit the magnetic particles onto the matrix as the matrix forms using a beam of the magnetic particles arranged to impinge upon the matrix to embed the magnetic particles in the matrix, and wherein at least one of the matrix material and the core is of ferromagnetic material and the core and the layer of metal of the magnetic particles are of different materials.

16. The apparatus according to claim 15, wherein the source of magnetic particles includes a cluster beam source.

17. The apparatus according to claim 15, wherein the source of magnetic particles includes a gas aggregation source.

18. The apparatus according to claim 15, wherein the source of matrix material is operable to cause an atomic beam of matrix material to impinge upon the substrate.

19. The apparatus according to claim 15, wherein the source of matrix material is operable to generate the matrix material by evaporation and sputtering.

20. The apparatus according to claim 15, wherein deposition of the layer of metal is by vacuum assisted deposition of metal vapour.

21. The apparatus according to claim 15, wherein the source of magnetic particles includes an evaporator disposed between a source of particle cores and the substrate.

22. The process according to claim 15, wherein the source of magnetic particles includes an evaporator disposed between a source of particle cores and the substrate, and wherein the evaporator is configured to define a space through which a beam of particle cores pass and the evaporator is operative to form a vapour of metal in the space whereby the vapour impinges upon a surface of each particle core.

* * * * *